United States Patent
Hongu et al.

[11] Patent Number: 6,036,932
[45] Date of Patent: Mar. 14, 2000

[54] METHOD FOR PURIFICATION OF SILICON

[75] Inventors: Tatsuhiko Hongu, Kanagawa-ken; Tomishi Kimura, Fukui-ken, both of Japan

[73] Assignee: Shin-Etsu Film Co., Ltd., Fukui-ken, Japan

[21] Appl. No.: 09/165,826

[22] Filed: Oct. 2, 1998

[30] Foreign Application Priority Data

Oct. 6, 1997 [JP] Japan .................................. 9-272455

[51] Int. Cl.⁷ .................................................. C01B 33/02
[52] U.S. Cl. ........................................... 423/348; 423/349
[58] Field of Search .................................... 423/348, 349, 423/350; 117/912

[56] References Cited

U.S. PATENT DOCUMENTS

| | | | |
|---|---|---|---|
| 3,008,887 | 11/1961 | Herglotz | 423/348 |
| 3,012,865 | 12/1961 | Pellin | 423/348 |
| 4,366,024 | 12/1982 | Ast et al. | 423/348 |
| 4,710,260 | 12/1987 | Witter et al. | 423/349 |
| 4,900,532 | 2/1990 | Kurz et al. | 423/348 |

FOREIGN PATENT DOCUMENTS 0 007 063  1/1980  European Pat. Off. .............. 423/348

*Primary Examiner*—Ngoc-Yen Nguyen
*Attorney, Agent, or Firm*—McAulay Nissen Goldberg Kiel and Hand, LLP

[57] ABSTRACT

Disclosed is an efficient and inexpensive method for the purification of low-grade silicon such as metallurgical-grade metallic silicon to give solar cell-grade silicon. The method comprises: (a) melting the starting low-grade silicon in a melting crucible; (b) bringing an end of an elongated linear fiber compact body of a refractory material, e.g., bundles of carbon fibers, into contact with the molten silicon in the crucible so that the molten silicon infiltrates and migrates through the fiber compact body by the capillary phenomenon to reach the other end of the fiber compact body held at a lower level than the first end; and (c) receiving the effluent of molten silicon discharged out of the second end of the fiber compact body in a receptacle crucible. The atmospheric gas is preferably a gaseous mixture of an inert gas, e.g., argon, and a small amount of a reactive gas, e.g., oxygen and hydrogen chloride, which reacts with the impurity elements such as boron and phosphorus in the starting low-grade silicon material to form a more volatilizable compound of the impurity element.

10 Claims, 1 Drawing Sheet

FIGURE
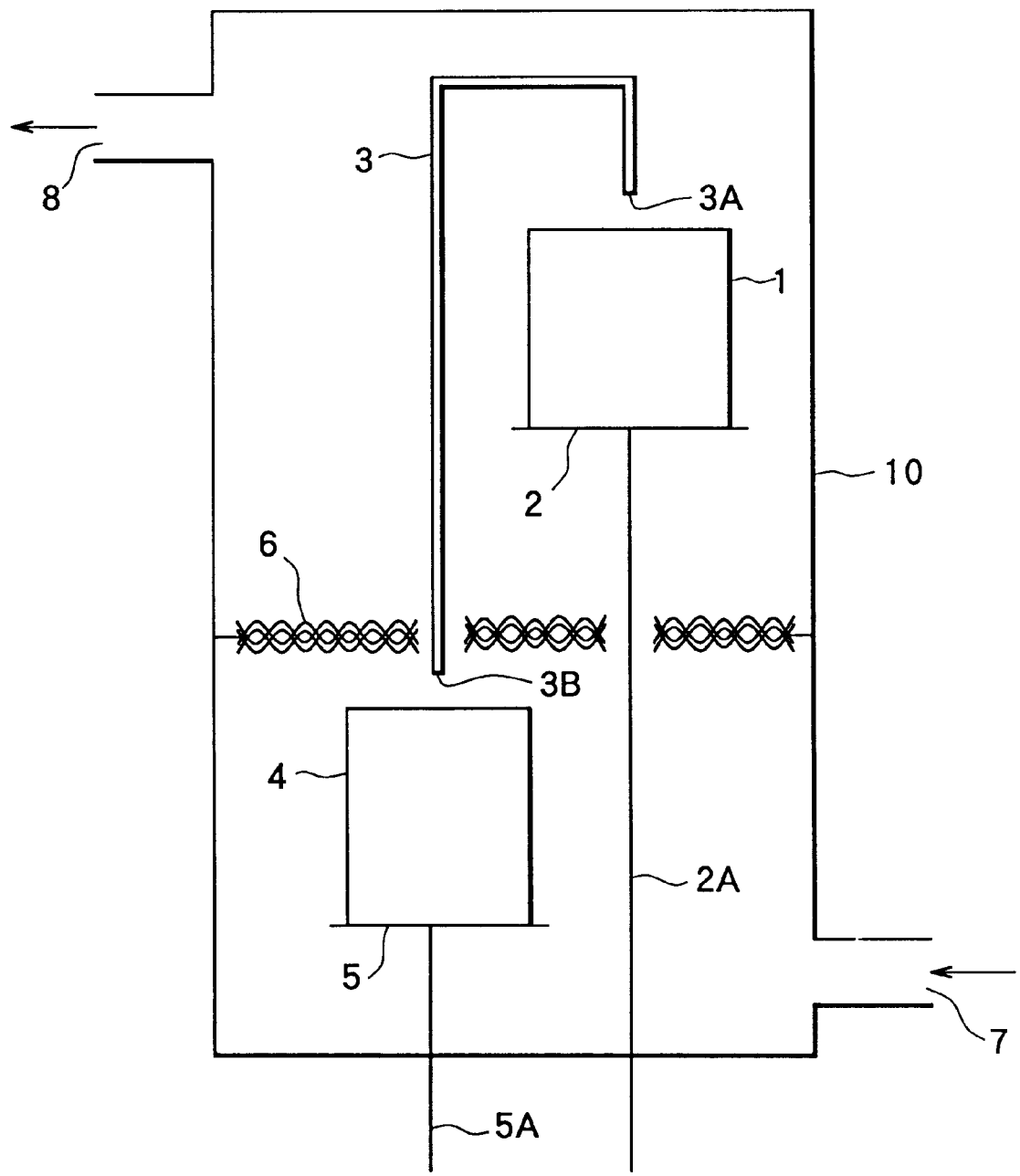

METHOD FOR PURIFICATION OF SILICON

BACKGROUND OF THE INVENTION

The present invention relates to a method for the purification of silicon or, more particularly, to an inexpensive and efficient method for the purification of low-grade silicon to obtain silicon having purity suitable and sufficient for use as an element of solar cells.

As is known, the most serious problems of global concern in the near future would include the problem of global warming-up as a consequence of the greenhouse effect due to accumulation of carbon dioxide gas produced by the combustion of various carbon-containing fuels, such as petroleums and coals, in the atmosphere and the problem of exhaustion of fossil fuels as a non-reproducible resource. In this regard, great efforts are being made for the research and development works of a substitute energy source which is free from exhaustion of resources and free from emission of carbon dioxide gas, of which the most promising and highlighted in recent years is the technology of solar power generation by the utilization of the solar energy as a clean and non-exhaustible energy source. Practically, the solar power generation is conducted by using so-called solar cells with solar panels of high-purity silicon as the cell elements capable of directly converting the solar energy into electric energy.

The largest factor which retards development of the solar power generating system and limits prevalence of the system is the expensiveness of high-purity silicon materials used for the solar cell elements so that various attempts and proposals have been made for the cost reduction in the production of high-purity silicon along with an improvement in the reliability of the solar power generating system.

Since the amount of demand for the high-purity silicon as a base material of solar cells still remains at a low level, the silicon material currently employed in the manufacture of solar cells is not a product from a process specialized therefor but mostly supplied by diversion of the silicon materials produced for other applications. For example, crystalline silicon as the base material of solar cells is supplied from the manufacturing process of semiconductor silicon devices such as an intermediate product and scraps such as conical cutoff debris of tops and tails taken from single crystal rods of semiconductor silicon as grown, remnant melt of silicon in the crucible after Czochralski growing of a single crystal silicon rod therefrom, unacceptable crystals, broken silicon wafers and so on.

While the quantity of high-purity silicon materials for solar cells currently available from the above mentioned diversion routes is naturally limited, the estimated demand of solar cell-grade silicon for fullscale development of the solar power generating system is so great that development of a process specialized for the production of solar cell-grade high-purity silicon is very important and urgent in order that the electric power cost by the solar power generating system can be competitive with the current cost of the electric energy by other traditional power generating systems.

As to the quality of the high-purity silicon for solar cell use, which has the P-type electroconductivity with a resistivity of 1 ohm.cm or higher, the purity thereof relative to the content of silicon is relatively low to be about 6-nines in % or somewhat higher as compared with the purity of the semiconductor-grade high-purity silicon which is said to be 11-nines or higher. This difference in the quality of the high-purity silicon materials between different applications is suggestive that there is no reason which may justify the diversion use of the semiconductor-grade high-purity silicon materials for the material of solar cells because the production cost of the semiconductor-grade high-purity silicon having overly quality is necessarily very high in order to enable a solar cell prepared therefrom to be competitive in costs with other power generating systems.

In view of the above described quality requirement for the solar cell-grade high-purity silicon, attempts have been made to upgrade metallurgical-grade metallic silicon, which has a silicon purity of 98% or higher and is under industrial mass production at low costs in the steel industry, to give solar cell-grade silicon having the above mentioned quality. The metallurgical-grade metallic silicon is produced by reducing silica stone as a mineral occurring in nature with a carbonaceous material such as cokes as the reducing agent so that the product unavoidably contains various impurities including boron and phosphorus which may have a great influence on the performance of the solar cells prepared from a silicon material containing these impurities. No efficient method, however, has been developed to remove these impurity elements from the metallurgical-grade metallic silicon to such an extent that the silicon can be used as the material of solar cells.

The annual production of the above mentioned silicon scraps is also quite large including the cutting dusts and chips generated in the slicing works of silicon single crystal rods for the preparation of semiconductor silicon wafers. Accordingly, it is also very advantageous to recycle and re-use these silicon scraps as the starting material in the production of solar cell-grade silicon materials at low production costs. Although these silicon scraps usually do not contain metallic impurities such as iron, calcium, aluminum and the like, the impurity contents of boron and phosphorus, which can be removed only with great difficulties, are also quite high as in the metallurgical-grade metallic silicon.

As a trend in recent years, moreover, many of the semiconductor memories are manufactured from semiconductor silicon wafers taken from a single crystal silicon rod having a P-type resistivity of 1 ohm.cm or lower and provided with a high-resistivity thin film of silicon by the epitaxial method on the wafer surface. As a consequence of this trend, an increasingly large portion of the silicon scraps produced in the semiconductor processes is occupied by low-resistivity silicon materials so that such a low-resistivity silicon scrap can be used as the starting material for the preparation of a solar cell-grade silicon material only by the combined use of a high-resistivity silicon scrap or freshly obtained high-resistivity polycrystalline silicon in such a proportion that the product as a combination thereof may have a resistivity of 1 ohm.cm or higher. This method, however, is also not practical to ensure production of solar-grade silicon at low costs due to the use of the relatively expensive resistivity-adjustment adjuvant silicon.

On the other hand, re-use of N-type silicon scraps containing phosphorus as the dopant is also under investigations but the difficulty encountered in the removal of the phosphorus impurity is the same as in the removal of the boron impurity.

In view of the above described situations, it is eagerly desired to develop an efficient and reliable purification method of low-grade silicon materials by which metallic impurities as well as boron and phosphorus could be removed from metallurgical-grade metallic silicon or silicon scraps.

As a method for the removal of boron and phosphorus from a low-grade silicon material, a proposal is made in Japanese Patent Kokai 4-16504 and 64-56311 in which the starting metallurgical-grade metallic silicon is melted under a reduced pressure in a direct-current arc furnace or electron beam furnace followed by unidirectional solidification. Further, Japanese Patent Kokai 9-48606 discloses a method in which purification of metallic silicon is performed by the combination of electron beam melting and ion beam irradiation.

The former of the above described methods, however, is not quite efficient for the removal of the impurities such as boron and phosphorus of which the distribution coefficient between solid and liquid phases of silicon is close to 1. Accordingly, an improvement of the method is proposed in which an oxidizing gas is intermixed with the atmospheric gas or a treatment with a calcium-based flux is undertaken though not with very promising results. The latter of the above described methods, on the other hand, is not advantageous in practicing and not suitable for mass production of solar cell-grade silicon at low costs because the technique to conduct the method is very elaborate and the investment for the apparatuses therefor is very great.

SUMMARY OF THE INVENTION

The present invention accordingly has an object to provide an efficient and inexpensive method for the purification of silicon or to provide an efficient and inexpensive method for the mass production of solar cell-grade silicon from low-grade silicon as the starting material.

Thus, the method of the present invention for the purification of silicon comprises the steps of:

(a) melting low-grade silicon in a first crucible to form a melt of silicon in an atmosphere of an inert gas under a reduced pressure;

(b) bringing a first end portion of an elongated linear fiber compact body of a refractory material into contact with the melt of silicon in the first crucible to cause infiltration and migration of the melt of silicon by the capillary phenomenon through the elongated linear fiber compact body toward the second end portion thereof held at a lower level than the first end portion in contact with the melt of silicon in the first crucible; and (c) receiving the melt of silicon transferred through the elongated linear fiber compact body and discharged out of the second end portion thereof as an effluent in a second crucible as a receptacle.

It is preferable in the above defined method of the present invention that the inert gas, which is argon, helium or nitrogen, forming the atmosphere is admixed with a limited amount of a reactive gas selected from the group consisting of oxygen, carbon dioxide, hydrogen chloride and water vapor.

BRIEF DESCRIPTION OF THE DRAWING

The FIGURE is a schematic illustration of an apparatus used for practicing the method of the present invention by an elevation view.

DETAILED DESCRIPTION OF THE PREFERRED EMBODIMENTS

As is described above, the method of the present invention is performed conveniently by causing infiltration and migration of a melt of silicon through an elongated linear fiber compact body of a refractory material having one end portion in contact with a molten pool of the starting low-grade silicon in a first crucible and the other end portion thereof held above a second crucible as a receptacle of the effluent silicon melt, the second end portion being at a lower level than the first end portion, under a controlled atmosphere. The inventive method can be practiced without using any very expensive apparatuses such as electron beam irradiation furnaces and ion beam irradiation furnaces so that the object of the invention can be accomplished inexpensively.

The process according to the inventive method is practiced by using, for example, an apparatus schematically illustrated in the figure of the accompanying drawing including a furnace chamber 10 in which a first crucible 1 for melting the starting low-grade silicon material is installed in the upper half part of the furnace chamber 10 as mounted on a crucible table 2 which is movable up and down by means of a shaft 2A. A receptacle crucible 4 is installed in the lower half part of the furnace chamber 10 as mounted on a crucible table 5 which is movable up and down by means of a shaft 5A. Though optional, the upper half part and the lower half part of the furnace chamber 10 are partitioned with a heat insulating separator 6. The furnace chamber 10 is provided with a gas inlet port 7 in the lower part and with a gas outlet port 8 in the upper part, through which the gas forming the atmosphere is introduced and pumped out, respectively, to control the gaseous atmosphere in which the process of the inventive method proceeds. The most characteristic component element in the system is an elongated linear fiber compact body 3 of a refractory material which bridges the melting crucible 1 and the receptacle crucible 4 something like a siphon tube having two legs.

In operating the above described apparatus system, the melting crucible 1 made from fused silica glass is first charged with the low-grade silicon material, such as silicon scraps, as the starting material which is heated and melted to form a pool of molten silicon in the melting crucible 1 in an atmosphere of a specific gas under a reduced pressure. Thereafter, the melting crucible 1 is moved upwardly so that the end portion 3A of the fiber compact body 3 is brought into contact with the molten silicon held in the melting crucible 1 and the molten silicon infiltrates the fiber compact body 3 by the capillary phenomenon and migrates through the fiber compact body 3 toward the other end portion 3B by the siphoning action because the second end portion 3B is held at a lower level than the first end portion 3A.

The low-grade silicon as the starting material in the inventive method is not particularly limitative provided that the silicon purity thereof is at least 98% by weight including commercially available products of metallurgical-grade metallic silicon and silicon scraps such as conical cutoffs taken from the top and tail of a single crystal silicon rod as grown, slicing debris, unacceptable intermediate products, broken wafers, remnants in the crucibles for Czochralski single crystal growing and so on. When the low-grade silicon material used as the starting material has a silicon purity lower than 98% by weight, the efficiency of purification of silicon by the inventive method is greatly decreased so that the silicon material cannot be imparted with a purity suitable for the solar cell use unless the procedure according to the inventive method is repeated twice or more. While the conventional commercial product of metallurgical-grade metallic silicon contains silicon carbide and free carbon besides the impurities such as aluminum, calcium, iron, titanium, boron, phosphorus and the like, the silicon scraps obtained from the processes relating to the semiconductor silicon production contains boron, phosphorus, silicon oxide and the like as the only impurities and is almost free from other metallic impurities and silicon carbide so that silicon scraps are usually preferred as the starting material in the inventive method in respect of the higher efficiency for purification.

As to the vertical positioning relationship between the melting crucible 1 and the receptacle crucible 4 in the furnace chamber 10, it is essential that the melting crucible 1 is installed in the upper half part of the furnace chamber 10 and the receptacle crucible 4 is positioned at a lower level than the melting crucible 1. When this requirement is not satisfied, the efficiency in the migration of the silicon melt through the fiber compact body 3 is greatly decreased. As is illustrated in the FIGURE, each of the melting crucible 1 and receptacle crucible 4 is provided with a height-adjusting means with the shaft 2A or 5A, respectively, for ascending and descending the respective tables 2 and 5 so as to keep the height difference between the crucibles 1 and 4 at an appropriate value. Alternatively, the melting crucible 1 and receptacle crucible 4 are each located at a fixed height while the fiber compact body 3 is movable in the vertical direction.

The heating means for melting the starting low-grade silicon material in the melting crucible 1 is not particularly limitative and can be any of resistance heating, arc heating, high-frequency induction heating and so on. The melt of silicon contained in the melting crucible 1 is kept at a temperature in the range from 1500 to 1650° C. or, preferably, from 1500 to 1600° C. When the temperature of the silicon melt is too high, vaporization of silicon may take place from the melt to decrease the yield of the purified silicon product along with heavy contamination of the apparatus walls with deposition of silicon.

The atmosphere inside the furnace chamber 10 is filled with an inert gas, which is argon, helium, nitrogen or a mixture thereof, or a gaseous mixture of an inert gas and a small volume of a reactive gas. When the amount of the impurities to be removed from the starting silicon material is relatively small, use of an inert gas alone would give a satisfactory result of impurity removal. When the starting silicon material contains plural kinds of impurities or the amount of the impurities is relatively large, however, admixture of a reactive gas to an inert gas is preferable in respect of the efficiency of impurity removal. Though not particularly limitative, the pressure of the atmosphere inside of the furnace chamber 10 is kept at a reduced pressure, preferably, in the range from $10^{-4}$ to $10^{-2}$ Torr. When the pressure is too low, evaporation of the molten silicon is increased to cause a material loss while, when the pressure is too high, a decrease is caused in the efficiency of impurity removal from the molten silicon.

In the case where semiconductor silicon scraps are used as the starting low-grade silicon material in the inventive method, the impurities to be removed during infiltration and migration of the molten silicon through the elongated linear fiber compact body 3 of a refractory material are usually boron and phosphorus alone so that the inert gas forming the atmosphere can be nitrogen gas. It should be taken into consideration, however, that nitrogen gas is reactive with molten silicon at a high temperature to form silicon nitride decreasing the efficiency of the purification process.

The reactive gas to be diluted with the inert gas to form the atmosphere is, though dependent on the kind of the impurity element to be removed, selected from the group consisting of oxygen, carbon dioxide, hydrogen chloride and water vapor. These reactive gases are used with an object to convert the impurity element contained in the molten silicon by the reaction with the reactive gas into a compound having a relatively low boiling point or relatively high vapor pressure which can readily be swept out of the furnace chamber 10 through the gas outlet port 8. The content of the reactive gas in the atmospheric gas is preferably in the range from 1 to 5% by weight. When the concentration of the reactive gas is too high, the reactive gas attacks various parts of the apparatus system such as chamber walls and heater elements to decrease the service life of the apparatus in addition to the possible reaction with the molten silicon to decrease the yield of the purified silicon product. When the concentration of the reactive gas is too low, on the other hand, boron and phosphorus as the impurities cannot be completely removed.

The refractory material forming the elongated linear fiber compact body 3 is selected from the group consisting of silicon carbide, silicon nitride and carbon of a high purity. The form of the linear fiber compact body 3 can be a yarn, braid, felt, woven sheet or tow. The refractory material and the form of the fiber compact body 3 should be selected depending on the kind of the impurity elements in the starting silicon to be removed. When the elongated linear fiber compact body 3 is formed from carbon fibers, for example, the molten silicon and the carbon fibers readily react in an exothermic reaction as the molten silicon comes into contact with the carbon fibers to convert the carbon fibers into silicon carbide fibers so that infiltration and migration of the molten silicon proceeds through the fiber compact body 3 of silicon carbide fibers. It should be noted that conversion of carbon fibers into silicon carbide fibers usually causes a decrease in the mechanical strength of the fiber compact body 3 so that, when a fiber compact body 3 is to be used repeatedly in several runs, the elongated linear fiber compact body 3 of carbon fibers is provided in advance with a reinforcing means or supporting means made from a carbonaceous material.

The velocity of infiltration and migration of molten silicon through the elongated linear fiber compact body 3 depends on the size of the fiber compact body 3 and the level difference between the melting crucible 1 and the receptacle crucible 4. When the elongated linear fiber compact body 3 is a strand formed from only a relatively small number of filaments, the amount of infiltration of the molten silicon is necessarily limited so that the productivity in the purification of silicon cannot be high though with an increase in the degree of purification. When the elongated linear fiber compact body 3 has a large cross section as formed from a bundle of a large number of tows, on the other hand, the rate of infiltration and migration of the molten silicon through the fiber compact body 3 is increased in proportion to the cross sectional area of the fiber compact body 3. Since purification of the molten silicon takes place during movement of the molten silicon through the fiber compact body 3, the degree of purification of the molten silicon can be improved by using a spiral-wound or zigzag-bent linear fiber compact body with an increased path length for the migration of the molten silicon.

The process of removal of impurity elements from the molten silicon infiltrating and migrating through the linear fiber compact body is a consequence of the difference in the vapor pressures. After removal of the impurities, the purified molten silicon is discharged as an effluent out of the lower end portion 3B of the elongated linear fiber compact body 3 and received in the receptacle crucible 4 which is made usually from fused silica glass. When the receptacle crucible 4 is kept at a temperature higher than the melting point of silicon, the purified silicon is obtained in the molten state as contained in the receptacle crucible 4. The degree of purification of the silicon can be further enhanced by subjecting the molten silicon to unidirectional solidification under a controlled cooling rate. Provided that the thus purified silicon obtained in the form of an ingot has properties suitable for the solar cell application, desired solar cell elements can be prepared by slicing the ingot into the form of the solar cell element without using a separate apparatus for ingot making. It is of course optional that the receptacle crucible 4 is kept at a temperature lower than the melting point of silicon so that the purified silicon is obtained in the form of solid which can be used for the re-purification treatment or a resistivity adjustment treatment. In this case, the table 5 for the receptacle crucible 4 is provided with a cooling means.

Although solar cell-grade purified silicon can usually be obtained by undertaking a single run of the above described purification procedure of the inventive method, it is a possible case that a single run of the purification procedure cannot give a silicon material having purity suitable for use as a solar cell element when the starting silicon material contains relatively large amounts of impurities as in the conventional products of metallurgical-grade metallic silicon. When such is the case, a sufficiently high purity of the silicon can be achieved by repeating the purification procedure twice or more. If excessive consumption of energy by repeating the same procedure twice or more should be avoided, it is optional that the furnace chamber 10 is filled with a gaseous mixture of the reactive gas diluted with an inert gas so that the impurity elements contained in the silicon react with the reactive gas and are converted into compounds having a relatively high vapor pressure to be readily dissipated from the molten silicon.

It is advantageous when the starting low-grade silicon contains large amounts of impurity elements that a filter of carbon fibers (not shown in the figure) is installed at the gas outlet port 8 of the furnace chamber 10 to capture the compounds formed as the reaction product of the impurity element and the reactive gas. Needless to say, such a filter should be periodically cleaned or replaced with a fresh one in order to prevent decrease of the purification efficiency. The partitioning separator 6 is provided above the receptacle crucible 4 with an object to prevent re-contamination of the purified silicon contained in the receptacle crucible 4 with the impurities contained in the gaseous atmosphere in the upper part of the furnace chamber 10 formed as a product of the reaction between the impurity element in the starting silicon and the reactive gas in the gaseous atmosphere.

In the following, the method of the present invention is illustrated in more detail by way of Examples which, however, never limit the scope of the invention in any way.

EXAMPLE 1

A melting crucible 1 of fused silica glass having an inner diameter of 450 mm and a depth of 250 mm was charged with 20 kg of N-type semiconductor silicon wafers having a resistivity of 0.5 ohm.cm and 15 kg of remnant silicon in the crucible having a P-type resistivity of 0.5 ohm.cm after Czochralski growing of a silicon single crystal rod. The melting crucible 1 was set on the crucible table 2 in a furnace chamber 10 illustrated in the FIGURE. The silicon materials contained in the melting crucible 1 were heated at a rate of 300° C./hour up to 1600° C. to be melted and kept at the same temperature for 1 hour under a vacuum pressure of $10^{-3}$ Torr to effect baking-out of the apparatus and the melt.

After completion of melting of silicon in the melting crucible 1, a gaseous mixture consisting of 98.5% by weight of argon and 1.5% by weight of oxygen was introduced through the gas inlet port 7 into the furnace chamber 10. Thereafter, the melting crucible 1 was gradually raised upwardly by means of the shaft 2A until the silicon melt in the melting crucible 1 came into contact with the lower end 3A of an elongated linear fiber compact body 3 which was a bundle of several tows of carbon fibers so that the silicon melt infiltrated and migrated through the fiber compact body 3 by the capillary phenomenon to reach the other end 3B of the fiber compact body 3 held at a lower level than the first end portion 3A, where the silicon melt was discharged as an effluent to drip into the receptacle crucible 4.

When infiltration of the silicon melt in the melting crucible 1 came to the end leaving substantially no silicon melt in the crucible 1, the heating power on the melting crucible 1 was turned off and the receptacle crucible 4 was gradually cooled down to effect solidification of the molten silicon therein so that about 33 kg of a silicon ingot was obtained, which had a P-type resistivity of 1.8 ohm.cm to ensure utilizability of the thus purified silicon material in the solar cell application.

The carbon fibers forming the fiber compact body 3 after completion of the above described purification process of silicon were found to have been entirely converted into fibers of β-silicon carbide.

EXAMPLE 2

The experimental procedure was about the same as in Example 1 described above excepting for the replacement of the starting silicon material with the same amount of metallurgical-grade metallic silicon having a silicon purity of 99.17% by weight and containing impurities including 0.40% by weight of iron, 0.25% by weight of aluminum, 0.10% by weight of calcium and 0.08% by weight of titanium and replacement of the atmospheric gas with a gaseous mixture consisting of 98.0% by weight of argon and 2.0% by weight of a 2:1 by weight combination of oxygen and water vapor. The height of the melting crucible 1 relative to the elongated linear fiber compact body 3 was so adjusted that the lower end 3A of the fiber compact body 3 was held within 2 cm above the crucible bottom without contacting therewith. After completion of infiltration and migration of the silicon melt through the fiber compact body 3, the receptacle crucible 4 on the table 5 was gradually cooled by lowering at a rate of 1 mm/minute by means of the shaft 5A. The thus obtained ingot of purified silicon had a P-type resistivity of 1.1 ohm.cm. This property of the purified silicon is suggestive that the silicon product is utilizable as a material of solar cells by mixing with another silicon product having a higher resistivity.

EXAMPLE 3

The experimental procedure was substantially the same as in Example 1 excepting for the re-use of, instead of a fresh linear fiber compact body of carbon fibers, the elongated linear fiber compact body 3 after use in Example 1, which now consisted of silicon carbide fibers as a result of conversion from the original carbon fibers by the reaction with molten silicon. Further, the melting crucible 1 and the receptacle crucible 4 were each held at a fixed height and, instead, the elongated linear fiber compact body 3 was provided with a mechanism for vertical movement directly connected to a load cell, by means of which proceeding of infiltration and migration of the silicon melt through the fiber compact body was monitored to detect the end point of infiltration.

The thus obtained purified silicon ingot had a P-type resistivity of 2.2 ohm.cm and was found to have properties suitable for use in the solar cell application. The resistivity of the product was higher than that in Example 1 presumably because the fiber compact body 3 here used had been fully refined by the reaction in Example 1.

EXAMPLE 4

The experimental procedure was substantially the same as in Example 1 except that the atmosphere inside of the furnace chamber 10 was filled with pure argon gas instead of the gaseous mixture of argon and oxygen used in Example 1. The thus obtained purified silicon ingot had a P-type resistivity of 1.5 ohm.cm and was found to have properties fully suitable for use in the solar cell application.

EXAMPLE 5

The experimental procedure was substantially the same as in Example 1 excepting for the replacement of the silicon scraps as the starting material with the same amount of metallurgical-grade metallic silicon having a silicon content of 98.7% by weight and use of a 97:3 by weight mixture of argon and hydrogen chloride as the atmospheric gas instead of the argon/oxygen mixture. As was the case in Example 2, the end portion 3A of the fiber compact body 3 of carbon fibers was held within 2 cm above the bottom of the melting crucible 1 not to be contacted with the crucible bottom. Further, the receptacle crucible 4 was gradually lowered at a rate of 1 mm/minute to effect slow solidification of the silicon melt as received therein. The thus obtained purified silicon ingot had a P-type resistivity of 1.2 ohm.cm and was found to have properties fully suitable for use in the solar cell application.

Comparative Example 1

The experimental procedure was substantially the same as in Example 1 excepting for the use of a 90:10 by weight mixture of argon and oxygen as the atmospheric gas instead of the 98.5:1.5 by weight mixture of argon and oxygen. The result was that the surface of the silicon in the receptacle crucible 4 was found to be lusterless and discolored due to formation of silicon oxide on the surface along with an increase in the consumption of the carbonaceous material forming the various parts in the furnace chamber 10.

Comparative Example 2

The experimental procedure was substantially the same as in Example 1 except that the melt of silicon in the melting crucible 1 was kept at 1700° C. instead of 1600° C. The result was that the yield of the purified silicon product was remarkably decreased due to increased evaporation loss of the molten silicon along with conversion of the carbonaceous material of the furnace chamber 10 into silicon carbide to cause degradation.

What is claimed is:

1. A method for the purification of silicon which comprises the steps of:
   (a) melting low-grade silicon in a first crucible to form a melt of silicon at a temperature in the range from 1500° C. to 1650° C. in an atmosphere of an inert gas selected from the group consisting of argon, helium and nitrogen under a reduced pressure;
   (b) bringing a first end of an elongated linear fiber compact body of a refractory material into contact with the melt of silicon in the first crucible to cause infiltration and migration of the melt of silicon by the capillary phenomenon through the elongated linear fiber compact body toward the second end thereof held at a lower level than the first end in contact with the melt of silicon in the first crucible thereby removing phosphorus, boron and any metallic impurities from the low grade silicon; and
   (c) receiving the melt of silicon transferred through the elongated linear fiber compact body and discharged out of the second end thereof as an effluent in a second crucible as a receptacle.

2. The method for the purification of silicon as claimed in claim 1 in which the reduced pressure of the atmosphere in which the low-grade silicon is melted is in the range from $10^{-4}$ Torr to $10^{-2}$ Torr.

3. The method for the purification of silicon as claimed in claim 1 in which the refractory material of the elongated linear fiber compact body is selected from the group consisting of silicon carbide, silicon nitride and carbon.

4. The method for the purification of silicon as claimed in claim 1 in which the inert gas is argon.

5. The method for the purification of silicon as claimed in claim 1 in which the temperature of the melt of silicon in the first crucible is in the range from 1500° C. to 1600° C.

6. A method for the purification of silicon which comprises the steps of:
   (a) melting low-grade silicon in a first crucible to form a melt of silicon at a temperature in the range from 1500° C. to 1650° C. in an atmosphere of a gaseous mixture consisting of an inert gas selected from the group consisting of argon, helium and nitrogen and a reactive gas selected from the group consisting of oxygen, carbon dioxide, hydrogen chloride and water vapor in a mixing ratio of from 99:1 to 95:5 by weight under a reduced pressure;
   (b) bringing a first end of an elongated linear fiber compact body of a refractory material into contact with the melt of silicon in the first crucible to cause infiltration and migration of the melt of silicon by the capillary phenomenon through the elongated linear fiber compact body toward the second end thereof held at a lower level than the first end in contact with the melt of silicon in the first crucible thereby removing phosphorus, boron and any metallic impurities from the low grade silicon; and
   (c) receiving the melt of silicon transferred through the elongated linear fiber compact body and discharged out of the second end thereof as an effluent in a second crucible as a receptacle.

7. The method for the purification of silicon as claimed in claim 6 in which the reduced pressure of the atmosphere in which the low-grade silicon is melted is in the range from $10^{-4}$ Torr to $10^{-2}$ Torr.

8. The method for the purification of silicon as claimed in claim 6 in which the refractory material of the elongated linear fiber compact body is selected from the group consisting of silicon carbide, silicon nitride and carbon.

9. The method for the purification of silicon as claimed in claim 6 in which the inert gas is argon.

10. The method for the purification of silicon as claimed in claim 6 in which the temperature of the melt of silicon in the first crucible is in the range from 1500° C. to 1600° C.

\* \* \* \* \*